US011467084B2

(12) United States Patent
Liu et al.

(10) Patent No.: US 11,467,084 B2
(45) Date of Patent: Oct. 11, 2022

(54) METHODS FOR POLYSILICON CHARACTERIZATION

(71) Applicant: YANGTZE MEMORY TECHNOLOGIES CO., LTD., Wuhan (CN)

(72) Inventors: Junzhan Liu, Wuhan (CN); Chao Shen, Wuhan (CN); Zhiliang Xia, Wuhan (CN); Qiangmin Wei, Wuhan (CN); Lei Li, Wuhan (CN); Hai Song, Wuhan (CN); Bingguo Wang, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 307 days.

(21) Appl. No.: 16/706,008

(22) Filed: Dec. 6, 2019

(65) Prior Publication Data
US 2020/0400555 A1    Dec. 24, 2020

Related U.S. Application Data

(63) Continuation of application No. PCT/CN2019/092006, filed on Jun. 20, 2019.

(51) Int. Cl.
*H01L 21/02*    (2006.01)
*G01N 23/04*    (2018.01)
(Continued)

(52) U.S. Cl.
CPC ............. *G01N 21/31* (2013.01); *G01N 21/95* (2013.01); *G01N 23/04* (2013.01); *G01N 23/225* (2013.01);
(Continued)

(58) Field of Classification Search
CPC ........ G01N 21/31; G01N 21/95; G01N 23/04; G01N 23/20; G01N 23/225;
(Continued)

(56) References Cited

U.S. PATENT DOCUMENTS 6,284,552 B1 * 9/2001 Yamagata .............. G01N 21/33
438/14
2008/0011949 A1    1/2008 Sannomiya et al.
(Continued)

FOREIGN PATENT DOCUMENTS

CN    102565659 A    7/2012
CN    102592263 A    7/2012
(Continued)

OTHER PUBLICATIONS

English translation of the International Search Report and Written Opinion of the International Searching Authority dated Mar. 27, 2020 in PCT/CN2019/092006, 9 pages.
Chinese Office Action dated Apr. 1, 2020 in Patent Application No. 201980001162.8, 8 pages.
Combined Office Action and Search Report dated Jan. 10, 2020 in Chinese Patent Application No. 201980001162.8, 11 pages (with English translation of categories of cited documents)

*Primary Examiner* — Mark R Gaworecki
(74) *Attorney, Agent, or Firm* — Oblon, McClelland, Maier & Neustadt, L.L.P.

(57) ABSTRACT

Aspects of the disclosure provide methods for polysilicon characterization. The method includes receiving image data of a polysilicon structure formed on a sample substrate. The image data is in a spatial domain and is generated by transmission electron microscopy (TEM). Further, the method includes extracting frequency spectrum of the image data in a frequency domain. Then, the method includes selecting a subset of the frequency spectrum that corresponds to characteristic of first crystal grains that are of a first orientation, and transforming the selected subset of the
(Continued)

frequency spectrum to the spatial domain to construct a first spatial image for the first crystal grains of the first orientation.

10 Claims, 5 Drawing Sheets

(51) Int. Cl.
    *G01N 21/31*     (2006.01)
    *G01N 21/95*     (2006.01)
    *G01N 23/225*     (2018.01)
    *H01L 21/66*     (2006.01)

(52) U.S. Cl.
    CPC .. H01L 21/02595 (2013.01); H01L 21/02609 (2013.01); H01L 21/02667 (2013.01); H01L 22/12 (2013.01)

(58) Field of Classification Search
    CPC ......... H01L 21/02595; H01L 21/02609; H01L 21/02667; H01L 22/12
    See application file for complete search history.

(56) References Cited

U.S. PATENT DOCUMENTS

| | | | |
|---|---|---|---|
| 2012/0193633 A1* | 8/2012 | Kohno | H01L 29/66765 257/66 |
| 2016/0267643 A1 | 9/2016 | Park et al. | |
| 2018/0012348 A1 | 1/2018 | Ahn et al. | |

FOREIGN PATENT DOCUMENTS

| | | |
|---|---|---|
| CN | 102680444 A | 9/2012 |
| CN | 105976349 A | 9/2016 |
| CN | 107250777 A | 10/2017 |
| CN | 107851315 A | 3/2018 |
| CN | 108230303 A | 6/2018 |
| CN | 108445006 A | 8/2018 |
| CN | 108550138 A | 9/2018 |
| CN | 108961218 A | 12/2018 |
| TW | 201702991 A | 1/2017 |

* cited by examiner

METHODS FOR POLYSILICON CHARACTERIZATION

RELATED APPLICATION

This application is a bypass continuation of International Application No. PCT/CN2019/092006, filed on Jun. 20, 2019. The entire disclosure of the prior application is hereby incorporated by reference in its entirety.

BACKGROUND

Semiconductor manufactures developed vertical device technologies, such as three dimensional (3D) NAND flash memory technology, and the like to achieve higher data storage density without requiring smaller memory cells. In some examples, a 3D NAND memory device is formed based on a stack of alternating gate layers and insulating layers. The stack of alternating gate layers and insulating layers is used to form memory cells that are stacked vertically. The channel region of the memory cells is formed by a semiconductor material, such as polysilicon. The quality of polysilicon material affects various electrical performances of the memory cells, such as carrier velocity, channel current, subthreshold swing, and the like.

SUMMARY

Aspects of the disclosure provide methods for polysilicon characterization. The method includes receiving image data of a polysilicon structure formed on a sample substrate. The image data is in a spatial domain and is generated by transmission electron microscopy (TEM). Further, the method includes extracting frequency spectrum of the image data in a frequency domain. Then, the method includes selecting a subset of the frequency spectrum that corresponds to characteristic of first crystal grains that are of a first orientation, and transforming the selected subset of the frequency spectrum to the spatial domain to construct a first spatial image for the first crystal grains of the first orientation.

In some embodiments, the method includes detecting boundaries of a crystal grain in the first crystal grains according to brightness of pixels in the first spatial image, and determining a size of the crystal grain in the first crystal grains according to the detected boundaries. Further, in some examples, the method includes calculating a first area of the first crystal grains according to brightness of pixels in the first spatial image.

According to an aspect of the disclosure, the method includes selecting subsets of the spatial frequency spectrum that respectively correspond to characteristics of crystal grains of respective potential orientations, and respectively transforming the subsets of the spatial frequency spectrum to the spatial domain to construct spatial images for the respective potential orientations.

In some embodiments, the method includes calculating, in the respective spatial images, areas of the crystal grains for the respective potential orientations according to brightness of pixels in the respective spatial images, and summing the areas to calculate a total area of the crystal grains for the potential orientations.

Further, in some examples, the method includes determining a polysilicon crystallization ratio (PCR) based on a ratio of the total area of the crystal grains and an area of the polysilicon structure. Then, the method includes comparing the PCR to a PCR threshold that is determined based on electrical performance requirements of devices on a production substrate that is manufactured to form polysilicon channels for the devices with the sample substrate being used to monitor a quality of the polysilicon channels, and determining a further action on the production substrate based on the comparison.

To extract the frequency spectrum of the image data in the frequency domain, in some examples, the method includes performing a Fourier transformation on the image data of the polysilicon structure.

To transform the selected subset of the frequency spectrum to the spatial domain to construct the first spatial image for the first crystals of the first orientation, in some examples, the method includes performing an inverse Fourier transformation on the selected subset of the frequency spectrum.

To select the subset of the frequency spectrum that corresponds to the characteristic of the first crystals that are of the first orientation, in some examples, the method includes selecting at least a pair of frequency components that correspond to the first crystals of the first orientation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
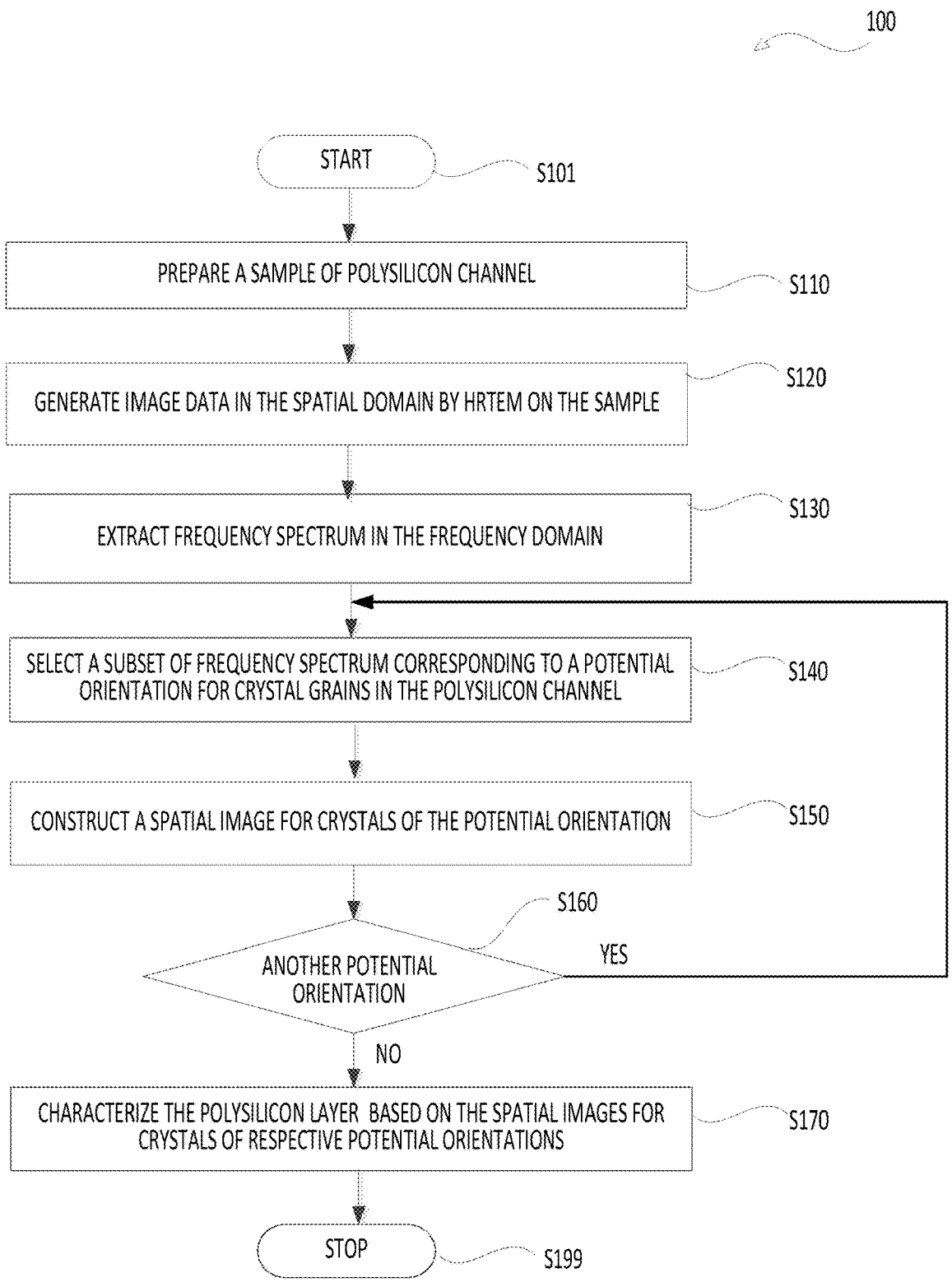
FIG. 1 shows a flow chart outlining a process example according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Aspects of the disclosure provide methods for polysilicon quality characterization. The methods are based on image processing of image data that is generated from transmission electron microscopy (TEM), such as high resolution TEM (HRTEM) that is capable of lattice resolution. Due to the use of HRTEM, the methods can handle characterization of samples of small dimensions. In some examples, the methods are used to characterize channel regions of memory cells in a three dimensional (3D) NAND memory device before the 3D NAND memory device is fully manufactured. In an example, the channel regions are formed of polysilicon of 10 nm thickness or less. While HRTEM can still generate image data of the channel regions, other methods, such as electron backscattered diffraction (EBSD), have difficulty to characterize the channel regions of such small dimension. Also, based on the polysilicon characterization of the present disclosure, suitable decisions, such as stop processing or discard wafer lots of low polysilicon quality, can be made earlier in the manufacturing process, such as in the front-end of the manufacturing process, comparing to some methods that make the decisions based electrical characterization of devices in the 3D NAND memory device which happens in or after the back-end of the manufacturing process. Thus the methods provided in the present disclosure can detect the wafer lots of low polysilicon quality earlier and save the manufacturing cost for further processing the wafer lots of low polysilicon quality.

It is noted that while 3D NAND memory devices are used as examples for polysilicon characterization in the present disclosure, it should be understood that the disclosed methods for characterizing polysilicon can be used for characterizing polysilicon quality in other suitable devices.

FIG. 1 shows a flow chart outlining a process example 100 according to some embodiments of the disclosure. The process 100 is used during, for example, 3D NAND memory device manufacturing to characterize channel material, such as polysilicon material, for memory cells. The process 100 starts at S101 and proceeds to S110.

At S110, samples for TEM are prepared. In some examples, a sample wafer is processed with production wafers to form channel regions. The production wafers are used for producing 3D NAND memory devices, and the sample wafer is used for polysilicon characterization. In some examples, the sample wafer is a scrap wafer, and is suitably processed, such as polished and cleaned, and is used for characterization purpose during manufacturing. In some examples, the sample wafer is processed with the production wafers from the beginning of the manufacturing process for the 3D NAND memory devices and undergoes the same processing steps before the channel regions are formed. In some other examples, the sample wafer is joined with the production wafer at suitable manufacturing steps to form the channel regions. In some other examples, some manufacturing steps that are not related to the polysilicon channels and do not affect the quality of the polysilicon channel are skipped for the sample wafer.

In some embodiments, a gate last process is used for producing the 3D NAND memory devices. During the gate-last process, for example, sacrificial layers and the insulating layers are alternatively deposited on substrates, such as the production wafers and the sample wafer. Then, photo lithography technology is used to define channel hole patterns in photoresist and/or hard mark layers, and etch technology is used to transfer the patterns into the stack of sacrificial layers and insulating layers, and to form channel holes. Then, channel structures are formed in the channel holes. In an example, a polysilicon layer and other suitable layers (e.g., oxide layers, and the like) are deposited in the channel holes and on the side surfaces of the channel holes.

In some embodiments, the sample wafer is sliced into sample pieces that respectively have one or more channel structures. The sample pieces are then polished, for example, from the back side (not the channel structure side) to reduce the thickness of the sample pieces to be suitable for TEM, such as HRTEM.

At S120, the sample pieces are sent to lab for TEM, such as HRTEM. In some embodiments, the HRTEM generates high resolution images of the samples in the spatial domain.

Figure 2:
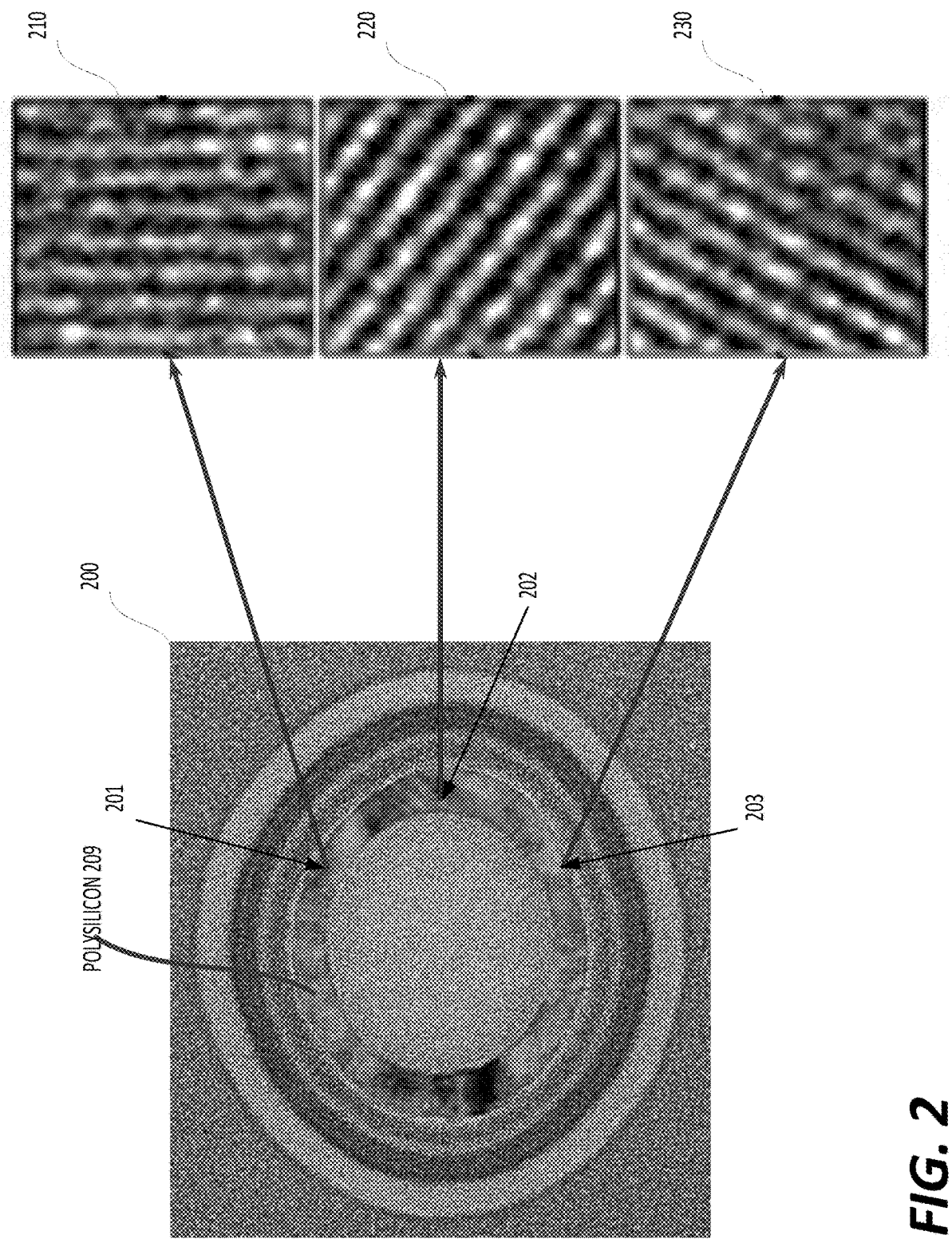
FIG. 2 shows a high resolution transmission electron microscopy (HRTEM) image for a channel structure.

FIG. 2 shows an HRTEM image 200 for a channel structure. The channel structure includes a plurality of donut shaped layers in a channel hole. One of the layers is formed of polysilicon, as shown by 209 in FIG. 2. The polysilicon layer 209 includes a plurality of crystal grains that each is a single crystal. The plurality of crystal grains may have different orientations.

FIG. 2 also shows close-up views 210, 220 and 230 at different locations 201, 202 and 203 of the polysilicon layer 209. The close-up views 210, 220 and 230 correspond to three separate crystal grains of different orientations at the different locations 201, 202 and 203. In a crystal grain, atoms are arranged in a crystal lattice. In some examples, the sample piece is very thin, when the sample piece is irradiated by an electron beam during TEM, some electrons may go through tunnels between columns of atoms, and cause bright stripes; and some electrons are scattered by the atoms and cause the dark lines. Because crystal grains may have different orientations, the bright-dark stripes may have different orientations, and also may have different pitch widths. In some examples, the orientations are represented using miller indices, and the orientations for crystal grains can be, for example, [1,1,1], [1,1,0], [1,0,0], and the like.

In some examples, the image data of the HRTEM images is sent to an image processing device, such as a computer and the like, for further processing. The image processing device can include one or more processors to process the image data. In some embodiments, the image processing device includes a memory device that stores instructions, and the processors can execute the instructions to perform the image processing. The image processing device can include other suitable components, such as a display, a touch panel, a user interface, a network interface, and the like.

Referring back to FIG. 1, at S130, frequency spectrum in the frequency domain is extracted from the image data in the spatial domain.

In some examples, the image processing device performs Fourier transformation on image data of an HRTEM image to extract amplitudes and phases of frequency components in the frequency domain. The amplitudes of the frequency components are generally provided as power spectrum that includes powers for frequency components in the HRTEM image. In an example, the image processing device uses the center of the channel hole as an origin point, and performs fast Fourier transformation (FFT) to obtain the power spectrum for the frequency components and phases for the frequency components.

Figure 3:
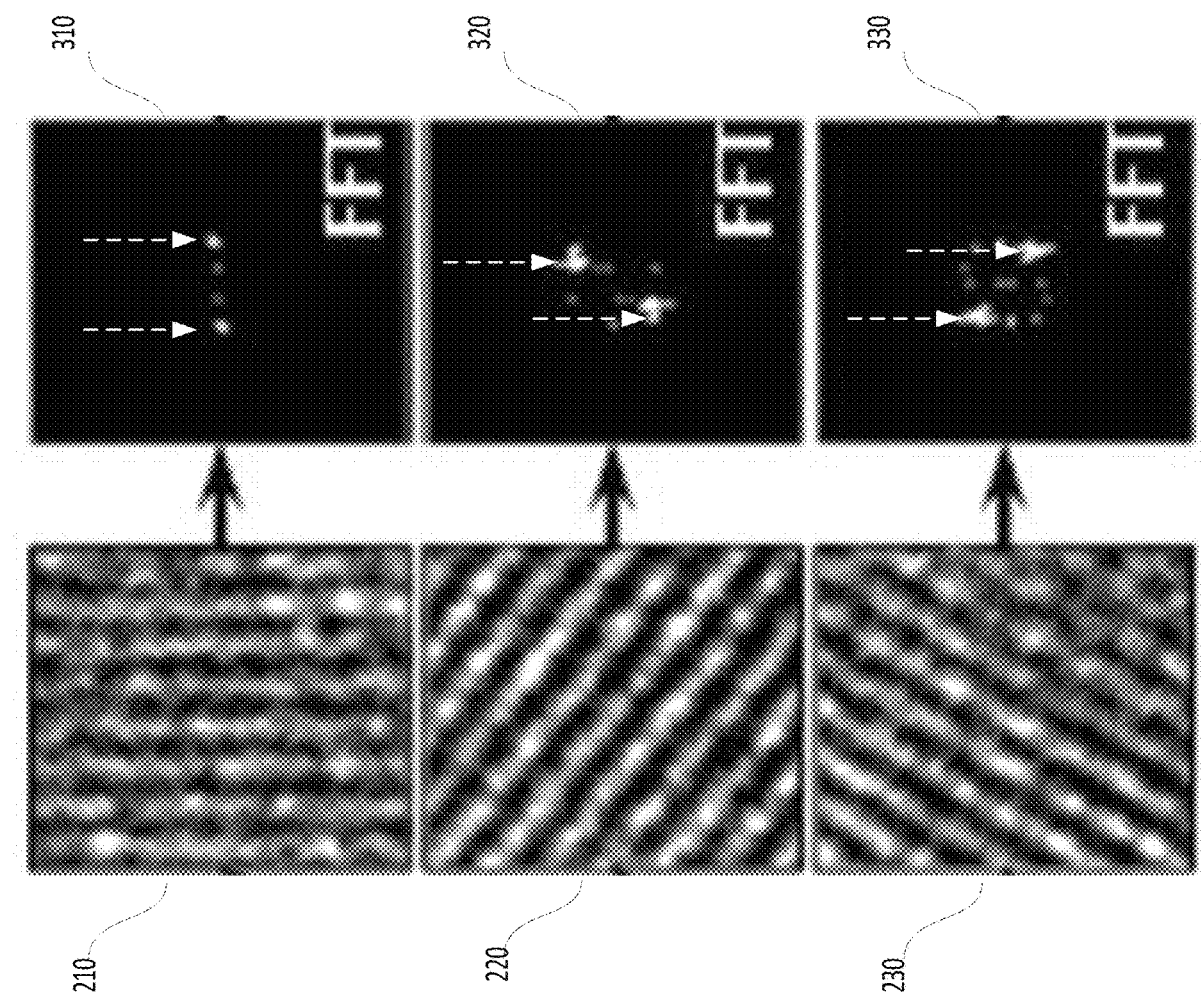
FIG. 3 shows a power spectrum illustration plot in the frequency domain for an HRTEM image.
Figure 3:
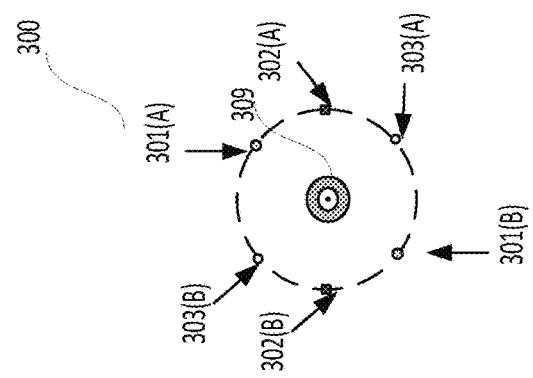

FIG. 3 shows a power spectrum illustration plot 300 in the frequency domain for an HRTEM image of a channel structure, such as the HRTEM image 200. The power spectrum illustration plot 300 includes spatial information, such as periodic information (e.g., parallel stripes), boundary information of grains, and the like.

According to some aspects of the disclosure, the center value of the power spectrum illustration plot 300 corresponds to an average power (e.g., related to an average greyscale value) of the HRTEM image. In some examples, some points that represent the frequency components in the power spectrum illustration plot are located around the center point symmetrically. In the power spectrum illustration plot 300, two points that are symmetrical to the center of the power spectrum illustration plot corresponds to a crystal orientation. In the FIG. 3 example, the points 301(A) and 301(B) correspond to the bright-dark stripes shown in the close-up view 220 that are generated by a crystal grain of a first orientation. The points 302(A) and 302(B) correspond to the bright-dark stripes shown in the close-up view 210 that are generated by a crystal grain of a second crystal orientation. The points 303(A) and 303(B) correspond to the bright-dark stripes shown in the close-up view 230 that are generated by a crystal grain of a third crystal orientation. When the polysilicon layer has more grains of a specific crystal orientation that other crystal orientations, the power at the two points corresponding to the specific crystal orientation is higher than the power at other points that correspond to the other crystal orientations in an example.

Further, the distance from a point corresponding to a crystal orientation to the center of the power spectrum illustration plot 300 is related to the pitch width of the bright-dark stripes for corresponding crystal orientation in the HRTEM image. For example, when the pitch width of the bright-dark strips for grains of a crystal orientation in the HRTEM image is d, the two points corresponding to the crystal orientation in the power spectrum illustration plot have a distance 1/d to the center of the power spectrum illustration plot. Thus, in an example, when stripes of multiple grains have the same pitch width, but the stripes of the multiple grains are of different directions, then the points on the power spectrum illustration plot 300 that correspond to the stripes of the multiple grains have the same distance to the center of the power spectrum illustration plot. In the FIG. 3 example, the bright-dark stripes in the close-up view 210, 220 and 230 have about the same pitch width, thus the points 301(A), 301(B), 302(A), 302(B), 303(A) and 303(B) have about the same distance to the center of the of the of the power spectrum illustration plot 300.

It is noted that, in some examples, the HRTEM image has additional bright-dark stripes that have different pitch width from the stripes in the close-up views 210, 220 and 230, then points corresponding to the additional bright-dark stripes may have different distance to the center of the power spectrum illustration plot 300.

FIG. 3 also shows respective FFT plots 310, 320 and 330 for the bright-dark strips in the close-up views 210, 220 and 230 of the HRTEM image. In the FFT plot 310, two points that are identified by two arrows represent the frequency component corresponding to the bright-dark stripes in the close-up view 210. In the FFT plot 320, two points that are identified by two arrows represent the frequency component corresponding to the bright-dark stripes in the close-up view 220. In the FFT plot 330, two points that are identified by two arrows represent the frequency component corresponding to the bright-dark stripes in the close-up view 230.

Further, in some examples, points in a specific area around the center, such as shown by 309 in FIG. 3 of the power spectrum illustration plot 300 are related to the sizes and boundaries of the grains. For example, the points that are in a donut area around the center of the power spectrum illustration plot have the boundary information of the crystal grains. In an example, when sizes of the crystal grains in the polysilicon layer are between a first value S1 (lower size limit) and a second value S2 (higher size limit). The inner circle for the donut area is determined based on the second value S2, for example, the radius of the inner circle is 1/S2. The outer circle for the donut area is determined based on the first value, for example, the radius of the outer circle is 1/S1.

Referring back to FIG. 1, at S140, a subset of frequency spectrum corresponding to a potential orientation for crystal grains in the polysilicon channel layer is selected.

According to an aspect of the disclosure, based on the power spectrum, potential orientations for crystal grains can be suitably identified. In some examples, silicon crystal grains have a limited number of potential orientations. For a potential orientation, the distance between atom planes can be suitably determined, and then pitch width d of bright-dark stripes in the HRTEM having potential orientation can be suitably determined, and further points corresponding to the potential orientation in the power spectrum illustration plot can be determined, for example with a distance 1/d to the center of the power spectrum illustration plot. Further, the direction of points corresponding to the frequency components in the power spectrum illustration plot is related to the direction of the bright-dark stripes. In some embodiments, a threshold is determined and used to identify significant orientations of major grains. For example, frequency components with power higher than the threshold can be selected for further processing.

In some embodiments, two symmetric points in the power spectrum correspond to a potential orientation. For the potential orientation, the two symmetric points and other suitable points, such as points in the donut area around the center of the power spectrum that are related to the sizes and boundaries of the grains, and the like, are selected in a subset of frequency spectrum corresponding to the crystal grains of the potential orientation in the polysilicon channel.

It is noted that, in some other embodiments, points that are unrelated to the specific potential orientation, are removed (de-selected) from the power spectrum in order to select the subset of frequency components for the specific potential orientation.

It is noted that the phases of the selected portion of the power spectrum can also be selected from the phase spectrum.

Referring back to FIG. 1, at S150, a spatial image for crystal grains of the potential orientation is constructed. In some examples, inverse Fourier transformation is performed based on the selected subset of frequency spectrum. In an example, inverse discrete Fourier transform (IDFT) is performed on the selected frequency components to construct the spatial image for the crystal grains of the potential orientation.

At S160, when there exists another potential orientation, the process returns to S140 to select another subset of frequency spectrum for the other potential orientation and to construct a spatial image of crystal grains for the other potential orientation. When, spatial images have been constructed for crystal grains of all potential orientations, the process proceeds to S170.

At S170, the polysilicon layer is characterized based on the spatial images for the crystal grains of the respective potential orientations. In an example, for each spatial image for crystal grains of a potential orientation, areas of crystal grains are calculated. In some examples, the area of a crystal grain is determined based on local average. For example, the grayscale value of each pixel is updated as an average (or a weighted average) of the pixel and neighboring pixels, such as neighboring pixels in a square having a width that is about the pitch width. Thus, in an example, the updated grayscale values for pixels in a crystal pixel are about medium grayscale values between bright and dark, and the grayscale values for pixels at locations with no crystal grain are dark. Then, the boundary of the crystal grains can be detected when a change of grayscale values of adjacent pixels is larger than a threshold. In some embodiments, the area of a crystal grain is calculated based on counting a number of pixels (having medium grayscale values) inside boundaries of the crystal grain. In some examples, a size of a crystal grain (e.g., width) is calculated based on counting a number of consecutive pixels (having medium grayscale values) in X or Y dimension and within boundaries of the crystal grain.

In some embodiments, the areas of crystal grains for the spatial images corresponding to the respective potential orientations are respectively calculated, then the areas of the crystal grains for the respective spatial images are summed up to obtain a total area of crystal grains in the polysilicon layer. Further, a polysilicon crystallization ratio (PCR) is calculated as a ratio of the total area of crystal grains to the area of the donut-shaped polysilicon area 209.

It is noted that crystal grain boundaries in the HRTEM image are generally not clear, and it is difficult to detect crystal grain sizes and are directly from the HRTEM. The disclosed image processing techniques construct spatial images for crystal grains of different orientations, and sharp the crystal grain boundary to ease crystal grain size detection and area calculation.

Figure 4:
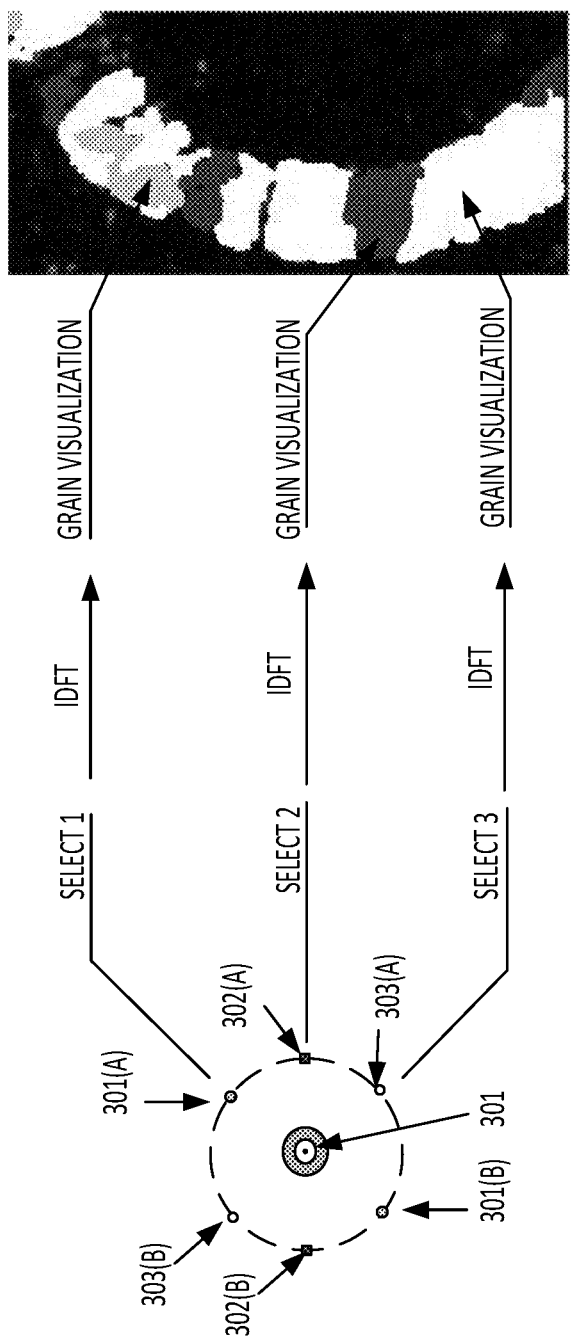
FIG. 4 shows plots to visualize crystal grains for a polysilicon layer according to some embodiments of the disclosure.

FIG. 4 shows plots to visualize crystal grains for the polysilicon layer according to some embodiments of the disclosure. In the FIG. 4 examples, points for different crystal orientations are respectively selected and IDFT are then respectively performed, and the suitable visual techniques are used to identify the crystal grains of the different crystal orientations. For example, the first selection includes a first subset of frequency spectrum, such as the frequency component represented by points 301(A), 301(B) and other suitable points, such as points in the donut-shaped area 309. Then, IDFT is performed on the first subset of frequency spectrum to construct a first spatial image. Based on the first spatial image, first crystal grains of a first crystal orientation are identified.

Further, the second selection includes a second subset of frequency spectrum, such as the frequency component represented by points 302(A), 302(B) and other suitable points, such as points in the donut-shaped area 309. Then, IDFT is performed on the second subset of frequency spectrum to construct a second spatial image. Based on the second spatial image, second crystal grains of a second crystal orientation are identified Further, the third selection includes a third subset of frequency spectrum, such as the frequency component represented by points 303(A), 303(B) and other suitable points, such as points in the donut-shaped area 309. Then, IDFT is performed on the third subset of frequency spectrum to construct a third spatial image. Based on the third spatial image, third crystal grains of a third crystal orientation are identified.

In some embodiments, the crystal grains can be suitably visualized using suitably visualization techniques. For example, in FIG. 4, the first crystal grains are visualized using light grey color, the second crystal grains are visualized using dark grey color, and the third crystal grains are visualized using white color. It is noted that other suitable visualization techniques can be used to visualize the crystal grains.

In some embodiments, the PCR is indicative of electrical performance of semiconductor devices, such as MOS devices, memory cell devices, and the like. For example, a device has a relatively higher PCR has a relatively small subthreshold swing (the gate voltage required to change the drain current by one order of magnitude), and a relative large channel current (under the same electrical and environmental conditions).

Figure 5B:
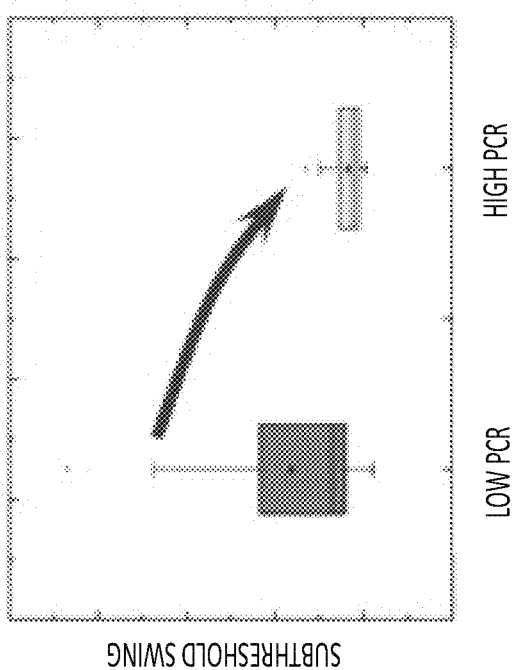
FIGS. 5A and 5B show relationships of device performance parameters to polysilicon quality.
Figure 5A:
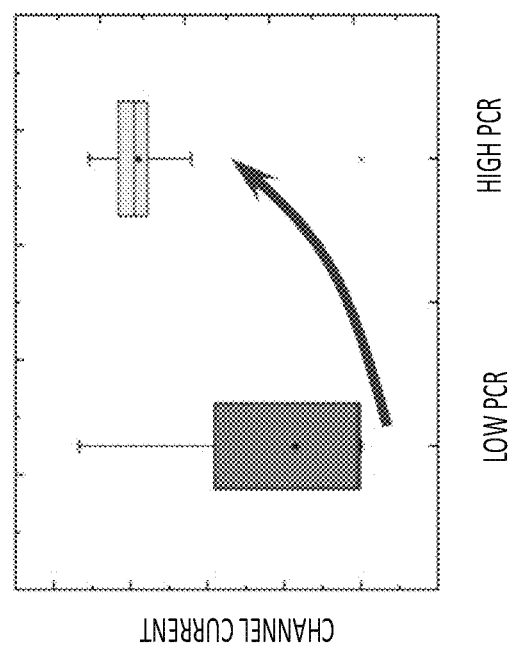

FIG. 5A shows a relationship of subthreshold swing value to the PCRs, and FIG. 5B shows a relationship of channel current to the PCRs. As shown, when PCR increases, the subthreshold swing decreases and channel current increases. Also, when PCR increases, the variations of the subthreshold swing and the channel current decrease.

In some examples, a PCR threshold is suitably determined based on electrical performance requirement. When a sample wafer for a lot of production wafers has a PCR that is higher than the PCR threshold, the lot of production wafers can be processed further; however when a sample wafer for a lot of production wafers has a PCR that is lower than the PCR threshold, the lot of production wafers may be scrapped, in an example. The process then proceeds to S199 and terminates.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for polysilicon characterization, comprising:
receiving image data of a polysilicon structure formed on a sample substrate, the image data being in a spatial domain and generated by a transmission electron microscope (TEM);
extracting frequency spectrum of the image data in a frequency domain;
selecting a subset of the frequency spectrum that corresponds to characteristic of first crystal grains that are of a first orientation; and
transforming the selected subset of the frequency spectrum to the spatial domain to construct a first spatial image for the first crystal grains of the first orientation.

2. The method of claim 1, further comprising:
detecting boundaries of a crystal grain in the first crystal grains according to brightness of pixels in the first spatial image; and
determining a size of the crystal grain in the first crystal grains according to the detected boundaries.

3. The method of claim 1, further comprising:
calculating a first area of the first crystal grains according to brightness of pixels in the first spatial image.

4. The method of claim 1, further comprising:
selecting subsets of the spatial frequency spectrum that respectively correspond to characteristics of crystal grains of respective potential orientations; and respectively transforming the subsets of the spatial frequency spectrum to the spatial domain to construct spatial images for the respective potential orientations.

5. The method of claim 4, further comprising:

calculating, in the respective spatial images, areas of the crystal grains for the respective potential orientations according to brightness of pixels in the respective spatial images; and summing the areas to calculate a total area of the crystal grains for the potential orientations.

6. The method of claim 5, further comprising:

determining a polysilicon crystallization ratio (PCR) based on a ratio of the total area of the crystal grains and an area of the polysilicon structure.

7. The method of claim 6, further comprising:

comparing the PCR to a PCR threshold that is determined based on electrical performance requirements of devices on a production substrate that is manufactured to form polysilicon channels for the devices with the sample substrate being used to monitor a quality of the polysilicon channels;

determining a further action on the production substrate based on the comparison.

8. The method of claim 1, wherein extracting the frequency spectrum of the image data in the frequency domain further comprises:

performing a Fourier transformation on the image data of the polysilicon structure.

9. The method of claim 1, wherein transforming the selected subset of the frequency spectrum to the spatial domain to construct the first spatial image for the first crystals of the first orientation further comprises:

performing an inverse Fourier transformation on the selected subset of the frequency spectrum.

10. The method of claim 1, wherein selecting the subset of the frequency spectrum that corresponds to the characteristic of the first crystals that are of the first orientation further comprises:

selecting at least a pair of frequency components that correspond to the first crystals of the first orientation.

* * * * *